US012811548B2

(12) United States Patent
Sutardja

(10) Patent No.: US 12,811,548 B2
(45) Date of Patent: Nov. 24, 2026

(54) ULTRA LINEAR CLASS AB, RF AMPLIFIER TOPOLOGY

(71) Applicant: Sehat Sutardja, Las Vegas, NV (US)

(72) Inventor: Sehat Sutardja, Las Vegas, NV (US)

( * ) Notice: Subject to any disclaimer, the term of this patent is extended or adjusted under 35 U.S.C. 154(b) by 411 days.

(21) Appl. No.: 18/622,565

(22) Filed: Mar. 29, 2024

(65) Prior Publication Data

US 2024/0356499 A1 Oct. 24, 2024

Related U.S. Application Data

(60) Provisional application No. 63/455,333, filed on Mar. 29, 2023.

(51) Int. Cl.

*H03F 3/191* (2006.01)
*H03F 1/56* (2006.01)
*H03F 3/24* (2006.01)

(52) U.S. Cl.

CPC ............. *H03F 1/565* (2013.01); *H03F 3/245* (2013.01); *H03F 2200/222* (2013.01); *H03F 2200/387* (2013.01); *H03F 2200/451* (2013.01)

(58) Field of Classification Search

CPC . H03F 3/191; H03F 3/193; H03F 3/45; H03F 3/45071

See application file for complete search history.

(56) References Cited

U.S. PATENT DOCUMENTS 4,590,436 A * 5/1986 Butler .................... H03F 3/1935 330/296
4,647,867 A * 3/1987 Butler ...................... H03F 3/191 330/276
6,949,978 B2 * 9/2005 Tayrani ................... H03F 3/191 330/251
9,859,844 B1 1/2018 Amiot
11,050,395 B2 * 6/2021 Jones ....................... H03F 1/565
2007/0222519 A1 9/2007 Deng et al.
2012/0112835 A1 5/2012 Comeau et al.
2014/0028398 A1 1/2014 Owen
2018/0076770 A1 * 3/2018 Arfaei Malekzadeh ..................... H03F 1/0205
2018/0167043 A1 * 6/2018 Van Zyl .................. B64C 11/02

* cited by examiner

*Primary Examiner* — Henry Choe

(57) ABSTRACT

An amplifier system comprising an input matching network configured to receive an input signal from a signal source. The input matching network is configured to impedance match between the amplifier system and the signal source. An input transformer is configured to receive the impedance matched input signal and perform voltage step down and current step up. An amplifier is configured to receive and amplify an output signal from the input transformer to generate an amplified signal. A low winding ratio output transformer provides isolation between an antenna and amplifier. An output matching network is configured to impedance match to an antenna and provide voltage step up. The input transformer may have a ratio of 2N:N, such as 2:1 ratio. At least one center tap of the input transformer may connect to a bias voltage. The amplifier system may be configured for operation in the radio frequency band.

20 Claims, 4 Drawing Sheets

ULTRA LINEAR CLASS AB, RF AMPLIFIER TOPOLOGY

1. FIELD OF THE INVENTION

The invention relates to RF amplifiers and in particular a linear class AB, RF amplifier.

2. RELATED ART

A novel class AB RF amplifier topology was introduced and patented as U.S. Pat. No. 8,378,750. However, this proposed design has some drawbacks which prevent it from being widely adopted. Recently, the inventor realized that this prior art amplifier design has several flaws that make it unsuitable for use as an RF power amplifier to produce high output power while still meeting the linearity requirements of modern communication standards (WIFI for example). One drawback was that the EVM characteristics of this prior art amplifier design falls below desired levels before the transistors in the amplifier run out of power supply voltage headroom. This ultimately results in poor efficiency. In short, the prior art amplifier topology is not competitive against the widely used common-emitter HBT GaAs RF amplifiers produced by the numerous companies, such as Qorvo® and Skyworks®.

SUMMARY

To overcome the drawbacks of the prior art and provide additional benefits, disclosed is an amplifier system with matching networks which comprises an input matching network configured to receive an input signal to be amplified from a signal source and output a matching network output signal. The input matching network is configured to impedance match between the amplifier system and the signal source. Also part of the amplifier system is an input transformer configured to receive the matching network output signal and output an input transformer output. The input transformer comprising a step-down transformer configured to provide current gain. An amplifier is configured to receive and amplify the input transformer output from the input transformer to generate an amplified signal. An output transformer is configured to receive the amplified signal and output an output transformer output signal such that the output transformer comprises a transformer ratio of less than 2:1. Also part of this embodiment is an output matching network configured to receive the output transformer output signal from the output transformer and output an output signal. The output matching network configured to impedance match between the amplifier system and downstream component.

In one configuration the downstream component is an antenna. The input matching network and the output matching network may comprise one or more capacitors and one or more inductors. In one embodiment, the amplifier comprises a multi-stage amplifier. The amplifier system may be configured to operate in the radio frequency band and the input signal may be a radio frequency signal.

In one embodiment the input matching network is configured to perform phase matching and current gain. It is contemplated that the output matching network is configured to perform impedance matching and voltage step up modification. In one configuration the input transformer is configured to provide a 2:1 voltage step down to achieve current gain. The output transformer may have a 1:1 winding ratio.

Also disclosed is a method for amplifying an input signal with an amplifier system that comprises an amplifier system comprising an input matching network, input transformer, amplifier, output transformer, and output matching network. The method includes receiving the input signal at the input matching network such that the input matching network is configured to impedance match between the input signal source and the amplifier system and provide an output signal of the input matching network to the input transformer. Then, performing a voltage step down function on the output signal from the input matching network to provide current gain and impedance matching between the input matching network and the amplifier to generate a stepped-down signal. This method also amplifies the stepped down signal with the amplifier to generate an amplified signal and perform isolation between the amplifier and the antenna with an output transformer located between the amplifier and the output matching network to generate a output transformer output signal. Then, performing, with an output matching network, impedance matching and voltage step up between the output transformer and a downstream element, which may comprise an antenna.

The output transformer may be a 1:1 transformer and the input transformer may be a 2:1 step down transformer. In addition, the input transformer includes a first center tap connected to a first bias voltage and a second center tap connected to a second bias voltage. The step of amplifying may comprise amplifying with a first stage amplifier and one or more additional amplifier stages. The amplifier system may be configured to operate in the radio frequency band and the input signal is a radio frequency signal. In one embodiment, the input matching network is configured to perform phase matching and current gain.

Also disclosed is an amplifier system comprising an input matching network configured to receive an input signal from a signal source, the input matching network configured to impedance match between the amplifier system and the signal source. An input transformer configured to receive the impedance matched input signal and perform voltage step down and current step up. An amplifier is configured to receive and amplify an output signal from the input transformer to generate an amplified signal. An output transformer is configured to receive the amplified signal such that the output transformer configured with a 1:1 winding ratio. An output matching network is configured to impedance match to an antenna and provide voltage step up. The input transformer may have a ratio of 2N:N where N is any whole number. In addition, a center tap of the input transformer may connect to a bias voltage.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Included in this disclosure, as foundational information, is U.S. Pat. No. 8,378,750 (assigned application Ser. No. 13/004,183), issued on Feb. 19, 2013, which is incorporated by reference in its entirety herein.

Figure 1:
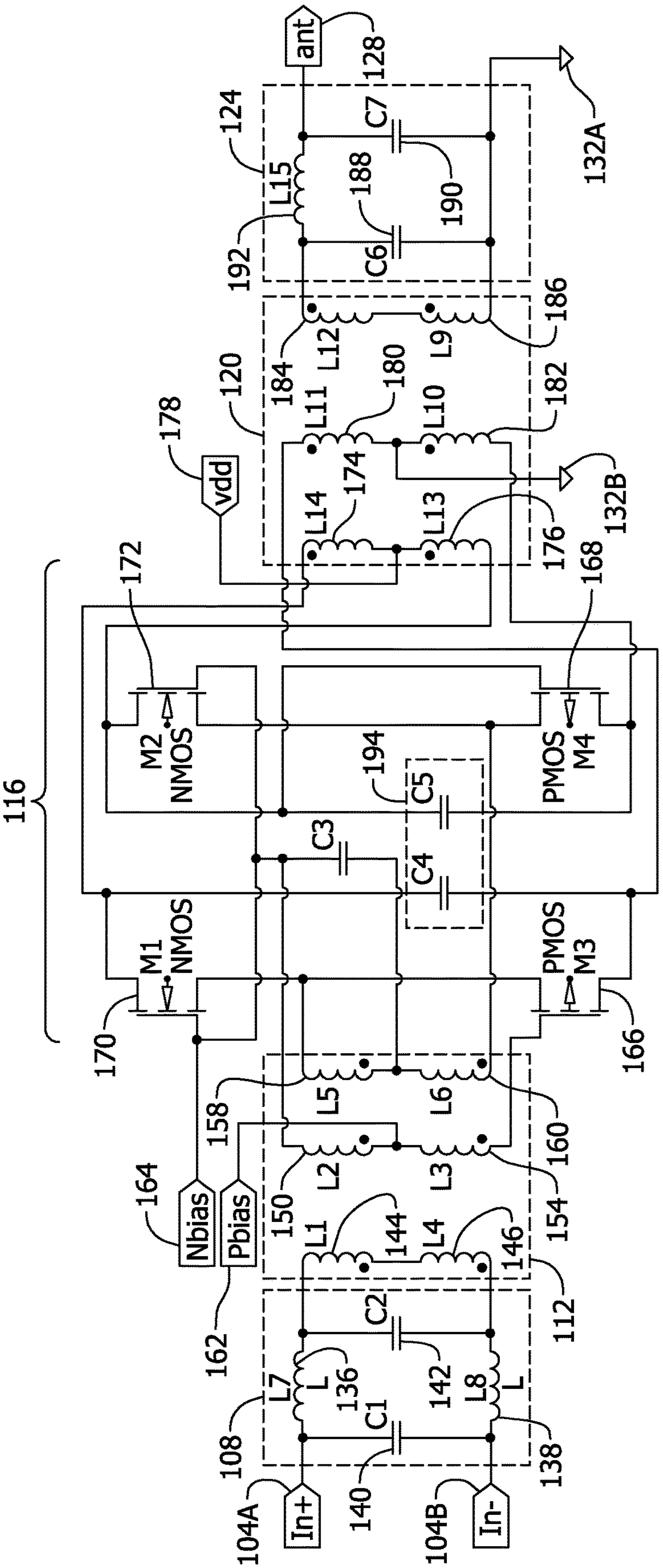
FIG. 1 illustrates an example embodiment of a class AB RF power amplifier.

Disclosed herein is an improved CMOS class AB RF amplifier that could deliver high output power levels at high linearity approaching that of an ideal linear RF power amplifier. A fully differential circuit design is shown because in CMOS which is by far the preferred choice. It is contemplated that this amplifier design may also be configured in a single ended configuration. Also, while only a single stage class AB amplifier is shown, it is contemplated that multiple of such stages (optionally scaled down appropriately for the front-end gain stages) could be cascaded to deliver an overall amplifier with a higher gain. Of course, the interstage RF transformers must be modified to interface to the drains of the back-to-back connected NMOS/PMOS transistors that are shown in FIG. 1 of the new class AB RF power amplifier. The example environments of use for this device include any amplifier for use in a communication device including wireless communication devices. The amplifier may be configured to drive a signal on an antenna.

As shown in FIG. 1, differential signal inputs 104A, 104B (collectively 104) are configured to receive an input signal. This is but one possible circuit level embodiment and it is contemplated that other component configurations are possible which do not depart from the claims.

As an overview, the inputs 104 connect to an input matching network 108, which in turn connects to an input RF transformer 112. The output of the input RF transformer connects to an amplifier 116, which provides an amplified signal to an output RF transformer 120. The RF transformer has an output that connects to an output matching network 124, which in turn provides the output signal on an output 128. Although shown as a differential signal input and a single ended output, referenced to ground 132A, it is disclosed that the circuit may be configured as fully differential or fully single ended.

The circuit of FIG. 1 is now described in more detail. The inputs 104 connect to the input matching network 108, which in this embodiment comprises interconnected capacitors 140, 142 and inductors 136, 138. The interconnected capacitor 140 connects to both the inputs 104A, 104B. The inductor 136 is in series in the positive input path while the inductor 138 is in series in the negative input path. At the opposing side of the inductors 136, 138 is the second interconnected capacitor 142, which connects between the positive signal path and the negative signal path. In this embodiment, the input matching network is configured to input-output phase matching and for additional current gain.

Within the input RF transformer 112 are several inductors, windings, or signal paths configured to form at least one transformer with associated signal coupling. In this embodiment, the input transformer 112 comprises a 2:1 step down RF transformer configured for current gain and impedance matching.

The positive signal path connects to a winding 144, while the negative signal path connects to a winding 146. The windings 144, 146 are in series as shown. Located in proximity to enable signal coupling are series connected windings 158, 160, as well as series connected windings 158, 160. A center tap between windings 150, 154 connects to a Pbias source 162 which provides a bias for the PMOS FETs in the amplifier 116. Similarly, the center tap between windings 158, 150 connects to a Nbias source 164 which connects to the gate terminals of the NMOS FETs in the amplifier 116.

The signal through the windings 144, 146 couples into windings 150, 154, 158, 160 as occurs in transformers. As such, transformer operation is not described in detail. Any type transformer structure may be utilized that is suitable for operation in a radio frequency signal environment. A center tap connection point of windings L5/L6 158, 160 connect to a capacitor C3, which in turn connects to an Nbias voltage source 164. A center tap connection point of windings L2/L3 150, 154 connects to a Pbias voltage source 162. Windings L2/L3 150, 154 also provide PMOS Gm boosting.

In this embodiment, there is boosting the PMOS devices and not the NMOS, although both could be boosted in other embodiments. The Gm boosting occurs because the gate of device 166 is connected to winding 154, while the source of device 166 is connected to winding 158 as shown. When connected with opposite polarity, as designated by the dot designation which indicates position, there is an increase gate to source voltage of device 166. Device 168 has a similar connection structure. With the source of device 166 is connected to the 'not the dot' winding terminal and the gate is connected to the 'dot' winding terminal. On the other side, the gate of device 168 is connected to the 'not the dot' winding terminal of winding 150, while the source terminal is connected to the 'dot' terminal of winding 160. The polarity is thus opposite of each other. If one voltage goes up, the other goes down. As a result, the gate winding provides opposite signal to the source winding which effectively drives the transistor 166, 168 stronger due to the greater differential between the respective gate and source terminals. The gate terminal is driven opposite to the source terminal which provides Gm boosting because the Gm becomes amplified or increased.

After the input RF transformer 112, the signal is presented to the amplifier 116. The amplifier includes PMOS FETs 166, 168 and NMOS FETs 170, 172. The outer terminals of the windings 150, 154 connect to the gate terminals PMOS FETs 166, 168. The outer terminals of the windings 158, 160 connect to the source terminals NMOS FETs 170, 172 and the source terminals of the PMOS FETs 166, 168. The drain terminal of the FETs 170, 166 and the drain terminals of the PMOS FETs 166, 168 connect to the outer terminals of windings 174, 180. The drain terminals of FETs 172, 168 connect to the outer terminals of windings 176, 182.

The amplifier also includes capacitors 194 connected as shown. These capacitors act as a harmonic rejection filter. These capacitors 194 (C4, C5) protect M1 and M3. C4 protect devices M1, M3 166, 170 from being stressed or pushed to failure when the drain to source voltage is driven with a high swing. Normally, a transistor will be damaged if the drain to source voltage is driven too high in relation to its voltage handling capability. If driven with high swing, the transistor M1, M3 can be damaged, but with the inclusion of the capacitors C4, the capacitors prevent such damage. The damage can occur when the drain to source is too high, and the transistor is turned on with a gate drive voltage, the transistor will be damaged.

The protection occurs because the capacitor allows the opposite transistor, which is running low voltage to turn on, so it brings the voltage down to prevent the damage when the gate is turned on. Thus, when one device is at high voltage, the opposite transistor is at low voltage. The capacitor pulls this voltage down to prevent damage before the transistor is turned on with a gate signal. Absent this capacitor connection, the transistor would be damaged. Thus, without this stress protection the device will be damaged. Capacitor C5 functions in a similar capacity.

The output RF transformer 120 comprises windings 174, 176, 180, 182, which couple into proximally located windings 184, 186. A center tap located between windings 174, 176 connects to a voltage source Vdd, while a center tap between windings 180, 182 connects to ground 132B as shown. The signal through the windings 174, 176, 180, 182 couples into windings 184, 186 as occurs in transformers. As such, transformer operation is not described in detail. Any type transformer structure may be utilized that is suitable for operation in a radio frequency signal environment. In one embodiment, the output RF transformer comprises a 1:1 output RF transformer with the L13/L14 174, 176 having a center tap connection point connected to voltage source Vdd 178. The windings L10/L11 182, 180 have a center tap connection point connected to ground 132B.

The outer terminal of winding 184 and the outer terminals of winding 186 connect to the output matching network 124. In particular, the outer terminal of winding 184 and the outer terminals of winding 186 connect to interconnected capacitor 188. The outer terminal of winding 184 also connects to inductor 192, which in turn connects to the antenna port 128, or other type of output port. The outer terminal of winding 186 also connects to ground as shown. The output matching network provides broadband antenna impedance matching as well as additional voltage step up.

Figure 2:
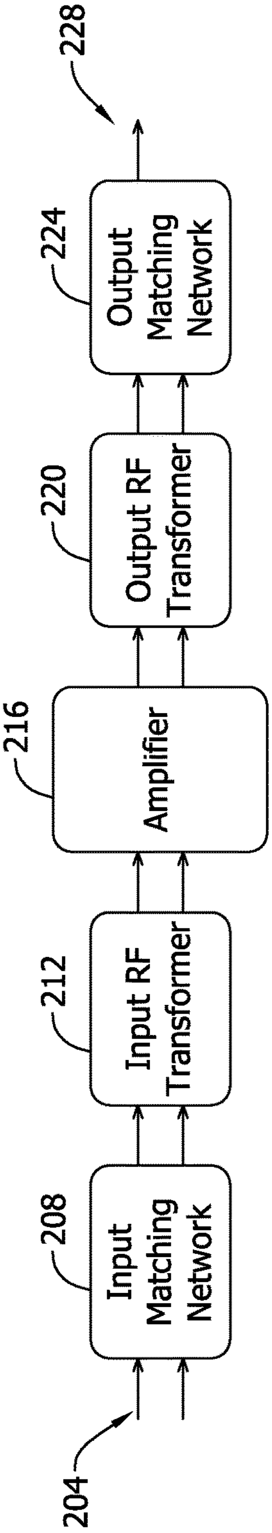
FIG. 2 illustrates a generalized block diagram of an amplifier with matching networks with input and output transformers.

FIG. 2 illustrates a generalized block diagram of an amplifier with matching networks with input and output transformers. In this embodiment, input terminals 204 connect to an input matching network 208. The input matching network 208 may comprise any combination of one or more resistors, capacitors, inductors, or active element to match the input terminals, and any upstream elements to any downstream elements to avoid reflections and achieve maximum power transfer.

The output from the input matching network 208 connects to an input RF transformer 212. The input RF transformer 212 may comprise any combination of windings, transformers, or related elements and connections. One or more voltage may be provided to the input RF transformer 212 to effect amplifier biasing. It is contemplated that other elements may be part of the RF transformer 212 in addition to the one or more transformers.

The output of the RF transformer 212 connects to an amplifier 216. Any type of configuration of amplifier may be utilized. The amplifier 216 may be single ended or differentially configured. Although not shown additional elements and/or biasing may be provided.

The output of the amplifier 216 connects to an output RF transformer 220. The output RF transformer 220 may be configured the same or different than the input RF transformer 212. The output RF transformer 220 may comprise any combination of windings, transformers, or related elements and connections. One or more voltages may be provided to the output RF transformer 220 to effect amplifier biasing. It is contemplated that other elements may be part of the output RF transformer 220 in addition to the one or more transformers.

The output of the output RF transformer 220 connects to the output matching network 224. The output matching network 224 may comprise any combination of one or more resistors, capacitors, inductors, or active element to match the output terminal's 228 impedance to any downstream elements to avoid reflections and achieve maximum power transfer.

Figure 3:
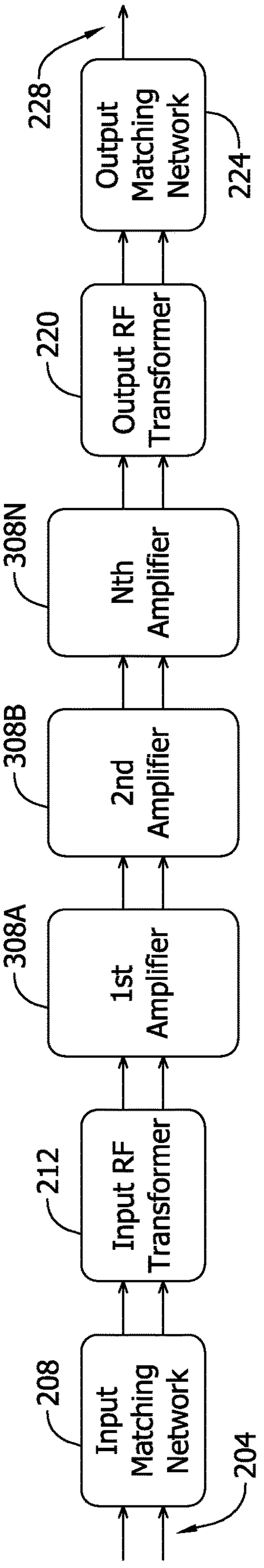
FIG. 3 illustrates a generalized block diagram of a multi-stage amplifier with matching networks with input and output transformers.

FIG. 3 illustrates a generalized block diagram of a multi-stage amplifier with matching networks with input and output transformers. This is but one possible example embodiment. As compared to FIG. 2, identical or similarly configured elements are labeled with identical reference numbers. Only the aspects of FIG. 3 which differ from FIG. 2 are discussed. In this embodiment, the amplifier comprises a multi-stage amplifier 308A, 308B, up to stage 308N where N is any whole number. Any number of amplifier stages may be used, and any type or format of amplifier may be utilized.

Several innovations are introduced to resolve the drawbacks of the prior art common gate class AB power amplifier topology:

Another improvement over the prior art is the introduction of an "anti-compression" step down current mode input stage RF transformer. The impedance of the secondary windings on the L5 & L6 connect to source terminals and are designed to the magnitude of jwL which is about the same as the impedance of the common gate amplifier M1, M2, M3, M4. The goal is to create low impedance. Looking into the source terminal of the transistors M1, M2, M3, M4 (166, 168, 170, 172) a low impedance is seen. As a result, the step-down transformer is connected on the input to this low impedance looking into the amplifier, and as the impedance of the amplifier becomes lower, such as at higher power the Gm goes up so impedance goes down. In this configuration though, the transformer has current gain beyond (in addition to) the normal gain of the step-down transformer which steps down voltage while stepping up voltage. Normally the transformer has a fixed gain, but when connected as shown, to a low impedance amplifier, there is additional current gain from the transformer, particularly when the amplifier is running at high power, which causes a lower amplifier input impedance. This ideally counteracts the typical compression (reduced gain from linear gain) at higher gain of the amplifier. This may be referred to as transformer current gain boosting. As Zin of the amplifier is lower, the transformer has more gain which counteracts the compression of the amplifier.

Thus, the anti-compression is achieved by targeting the secondary winding impedance (the magnitude of jwL) of the input stage RF transformer to be approximately equal to the input impedance of the Class AB push-pull back-to-back source connected NMOS/PMOS devices (the sources of M1-M4) when the amplifier is in the low to mid power operation (meaning while the transistors are still in the class A operation). As the transistors go into class B operation, the transistors would then increasingly go into compression due to the $G_mR_o$ of the transistors getting lower with increasing power. However, because at the same time the transistor input impedance (which is proportional to $1/G_m$) would go lower with increasing output power levels, the input RF current produced by the "anti-compression" input stage transformer would increase, thereby compensating for the well-known compressing behavior of the CMOS transistors at high output power. This is an important improvement over the prior art.

A further aspect of the disclosed amplifier is a lowering of the output stage transformer ratio. For example, prior art output transformers may be in the 2:1 or 4:1 ratio, while in one embodiment of the disclosed amplifier system the output stage transformer ratio is 1:1. In every CMOS amplifier produced in the market to date, to protect the CMOS transistors from being damaged, the transistors are operated at as low voltage as possible. At high output power however, the antenna needs to operate at high voltage levels. To compensate for this and avoid damage to the transistors, a step-up output transformer (such as a 2:1 or even 4:1 ratio (or 1:2 OR 1:4) or a voltage boosting power combiner architecture (4 series connected output stage combiner as shown in the prior art as found U.S. Pat. No. 7,256,573 for example) is used. U.S. Pat. No. 7,256,573 (assigned application Ser. No. 11/095,231), issued on Aug. 14, 2007, is incorporated by reference in its entirety herein. The prior art had aspects that could be improved.

The benefit of using a lower ratio, such as 1:1 is that the voltage is lower. The disclosed system may be equipped with an output transformer and impedance matching network as shown, such that there are two primary windings, one for the NMOS device and one for the PMOS device and a secondary winding and the matching network. This ratio is still 1:1.

It is known to use an output transformer having a high step-up ratio, such as 4:1 or 2:1, (as well as the series connected power combiner) but this harms efficiency. In contrast, the new topology disclosed herein uses a very low output transformer ratio (1:1) to achieve a high output stage transformer efficiency. To provide a high output voltage at the antenna port, an output matching network is introduced. In addition, to protecting the transistors, this innovation has the additional benefit of making the impedance appear at the drain connections, to be highly broadband, which is important to allow the common gate amplifier to function properly.

It is also proposed to apply a similar low transformer ratio consideration to the input stage. Currently, a low ratio input stage transformer is proposed (preferably no larger than a 2:1 ratio) and an input stage matching network to broadband. This input impedance will boost the overall passive input current gain of the 2:1 transformer close to or slightly above 3:1 to maximize the overall RF amplifier current gain. Together with item 2 above, the combination of an input stage matching network with a low ratio input stage transformer provides wide-bandwidth characteristics that are needed to make a truly wide band common gate amplifier.

A further feature of the disclosed design is introduction of a new $2^{nd}$ harmonic trap capacitor (C3) connecting the gates of the common gate transistors to the center tap of the source coil. The addition of this capacitor forces the gates to track the common mode signals seen at the sources which mainly consists of the $2^{nd}$ harmonic components, thus preventing the $2^{nd}$ harmonic components from cross modulating with the main/fundamental signal components. This will provide additional common mode rejection. The gate signal is tracking the source signal. In FIG. 1, only the NMOS gate connection is shown. This is because the new technique applied on the PMOS transistors to be shown next would require a different common mode cancellation solution. Stated another way, without the PMOS improvement, there would be a corresponding PMOS version of the new $2^{nd}$ harmonic trap capacitor connected from the PMOS gates to the center tap of the source coil.

Also disclosed is an optional $G_m$ boosting circuit on the PMOS transistors to overcome the low transconductance nature of the PMOS transistors. $G_m$ boosting of the PMOS transistors solves the fundamental weakness of the prior art, as the weak PMOS transistors cause massive buildup of $2^{nd}$ harmonic components at the transistor source terminals when the common gate amplifier goes into high output power levels. These $2^{nd}$ harmonic components would inevitably cross modulate with the fundamental signals causing further amplitude compression and worsening the output phase shift as the output power level increases.

An additional feature of the amplifier disclosed herein is the proper matching (sizing) of the effective $G_m$ of the NMOS and PMOS transistors. Because the PMOS $G_m$ boosting is done using a secondary gate winding coil, the $G_m$ boosting amount is achieved in integer increments. Using a 1:1 ratio for the gate/source coils, the PMOS $G_m$ is therefore boosted by a factor of 2. This may result in the effective $G_m$ of PMOS transistors to now be a little higher than that of the non-boosted NMOS counterpart. To overcome this reversed imbalance, the NMOS transistors may optionally be sized up (made slightly larger) relative to the PMOS transistors, to counteract this imbalance. In contrast, without $G_m$ boosting it is the PMOS transistors that need be made larger. However, in practice the viability of increasing the PMOS transistor sizes is very limited, as it would further reduce the already low Ft (transit frequency) of the PMOS transistors, thereby negating the potential benefits of lowering the $2^{nd}$ harmonic generation through increasing the size of the PMOS transistors. U.S. patent application Ser. No. 17/711,935 filed on Apr. 1, 2022, and published on Oct. 6, 2022 as Publication Number US-2022-0321067-A1 is incorporated in its entirety herein.

In one embodiment, symmetrical FinFet based PMOS and NMOS transistors may be used in certain implementations of this RF amplifier topology. FinFET devices are known in the art, and as such are not described in detail herein. Symmetrical NMOS and PMOS transistors drastically reduce the $2^{nd}$ harmonic content at the sources of the common gate amplifier to an absolute minimum even without $G_m$ boosting. Symmetrical transistors would also enable a simultaneous $G_m$ boosting of NMOS and PMOS transistors for making the overall RF amplifier smaller in size, especially for the front-end gain stages. $G_m$ boosting is also a fundamental solution to address lower frequency applications (such as the sub-2.5 GHz) by increasing the effective transistor input capacitances thus requiring smaller transformer sizes. Finally, simultaneous $G_m$ boosting using FinFet transistors would result in lower overall power consumption.

Figure 4:
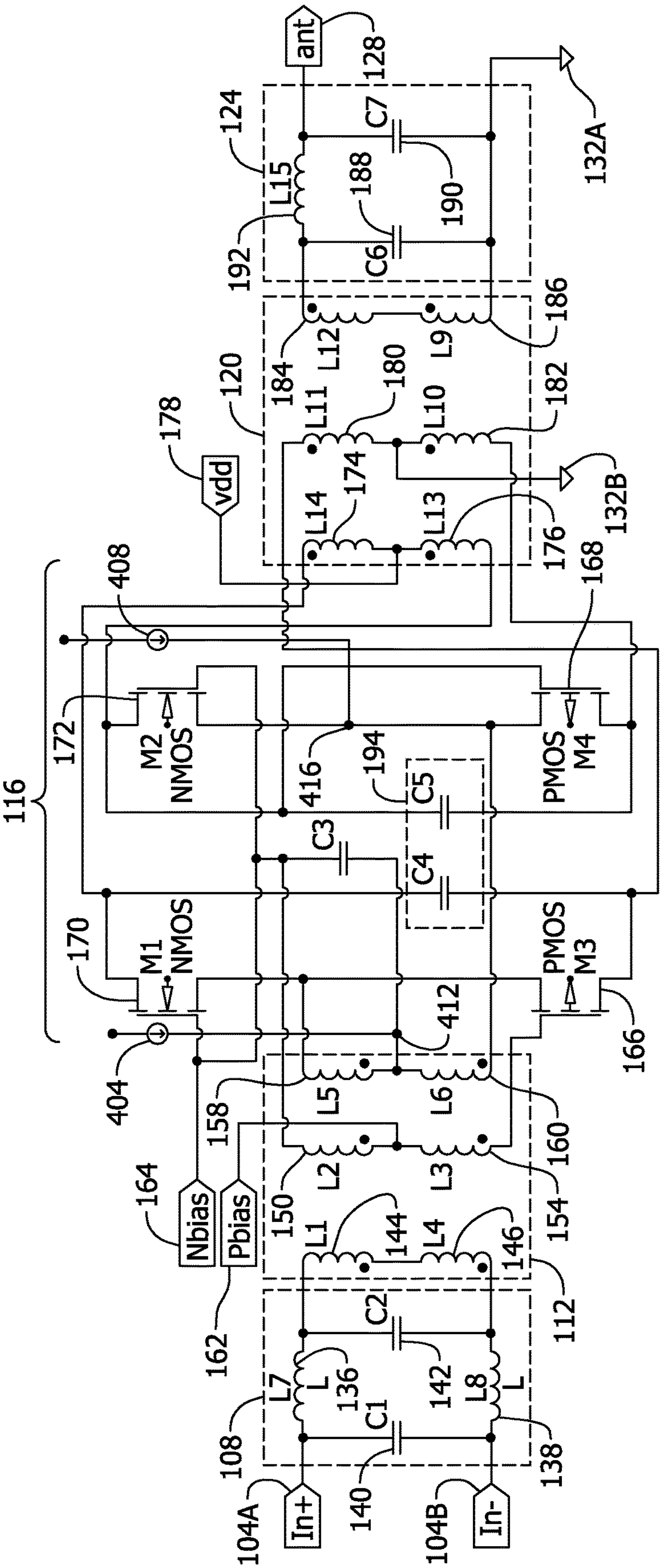
FIG. 4 illustrates an example embodiment of a class AB RF power amplifier with supplemental current sources.

Also proposed herein is the injecting of an extra current into the center tap of the source coil (which is equivalent to adding equal but half the current to each of the PMOS sources). This may be achieved using any type of current source 404, 408 as shown in FIG. 4. Both or either may be present. Any type or arrangement of current source may be used. The connections are to the center tap node 412 for current source 404 and to the source terminal node 416 for current source 408. The amount of additional current provided by current sources based on which of the device pairs, namely the PMOS device or NMOS devices would benefit with additional current. Either pair or both could be supplemented based on the $G_m$ of the transistor. This is an alternate method for increasing or supplementing the $G_m$ of the PMOS transistors to achieve a more balanced $G_m$. This approach, however, increases the power dissipation of the overall RF amplifier. It is nonetheless shown and proposed here for completeness.

Figure 5:
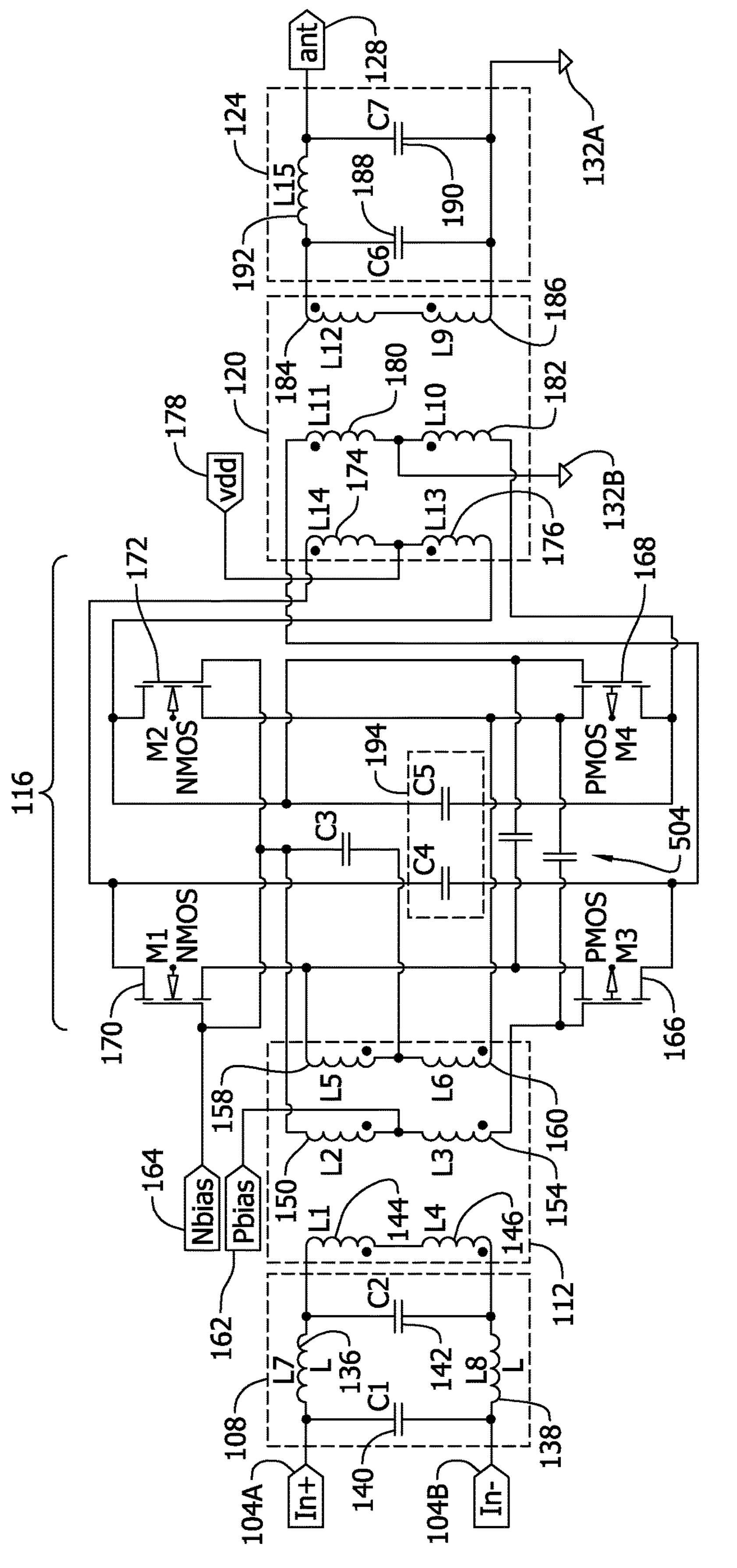
FIG. 5 illustrates an example embodiment of a class AB RF power amplifier configured with feed-forward capacitors.

Also part of some embodiments is the addition of a pair of feedforward capacitors across the opposite source and gate terminals of the $G_m$ boosted PMOS transistors. This is shown in FIG. 5 with capacitors 504 connected gate to source as shown. These are optional devices and one, both, or none may be present. This addition improves the couplings of the $2^{nd}$ and higher order common mode harmonics between the sources and gates of the PMOS transistors as the inherent common mode couplings between the source and gate boosting coils of the input stage transformer have limited coupling efficiency at high harmonics. The current sources of FIG. 4 may be combined with the capacitors of FIG. 5, or systems may have only one of these features.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. An amplifier system with matching networks comprising an input matching network configured to receive an input signal to be amplified from a signal source and output a matching network output signal, the input matching network configured to impedance match between the amplifier system and the signal source;

an input transformer configured to receive the matching network output signal and output an input transformer output, the input transformer comprising a step-down transformer configured to provide current gain;

an amplifier configured to receive and amplify the input transformer output from the input transformer to generate an amplified signal;

an output transformer configured to receive the amplified signal and output an output transformer output signal, the output transformer comprising an input to output ratio of less than 2:1; and an output matching network configured to receive the output transformer output signal from the output transformer and output an output signal, the output matching network configured to impedance match between the amplifier system and downstream component.

2. The system of claim 1 wherein the downstream component is an antenna.

3. The system of claim 1 wherein the input matching network and the output matching network comprises one or more capacitors and one or more inductors.

4. The system of claim 1 wherein the amplifier comprises a multi-stage amplifier.

5. The system of claim 1 wherein the amplifier system is configured to operate in the radio frequency band and the input signal is a radio frequency signal.

6. The system of claim 1 wherein the input matching network is configured to perform phase matching and current gain.

7. The system of claim 1 wherein the output matching network is configured to perform impedance matching and voltage step up modification.

8. The system of claim 1 wherein the input transformer is configured to provide a 2:1 voltage step down to achieve current gain.

9. The system of claim 1 wherein the output transformer has 1:1 winding ratio.

10. A method for amplifying an input signal with an amplifier system comprising:

providing an amplifier system comprising an input matching network, input transformer, amplifier, output transformer, and output matching network;

receiving the input signal at the input matching network, the input matching network configured to impedance match between the input signal source and the amplifier system and provide an output signal of the input matching network to the input transformer;

performing a voltage step down function on the output signal from the input matching network to provide current gain and impedance matching between the input matching network and the amplifier to generate a stepped-down signal;

amplifying the stepped down signal at the amplifier with the amplifier to generate an amplified signal;

performing isolation between the amplifier and the antenna with an output transformer between the amplifier and the output matching network to generate a output transformer output signal; and performing, with an output matching network, impedance matching and voltage step up between the output transformer and a downstream element.

11. The system of claim 10 wherein the downstream element is an antenna.

12. The system of claim 10 wherein the output transformer is a 1:1 transformer.

13. The system of claim 10 wherein the input transformer is a 2:1 step down transformer.

14. The system of claim 13 wherein the input transformer includes a first center tap connected to a first bias voltage and a second center tap connected to second bias voltage.

15. The system of claim 10 wherein amplifying comprises amplifying with a first stage amplifier and one or more additional amplifier stages.

16. The system of claim 10 wherein the amplifier system is configured to operate in the radio frequency band and the input signal is a radio frequency signal.

17. The system of claim 10 wherein the input matching network is configured to perform phase matching and current gain.

18. An amplifier system comprising:

an input matching network configured to receive an input signal from a signal source, the input matching network configured to impedance match between the amplifier system and the signal source;

an input transformer configured to receive the impedance matched input signal and perform voltage step down and current step up;

an amplifier configured to receive and amplify an output signal from the input transform to generate an amplified signal;

an output transformer configured to receive the amplified signal, the output transformer configured with a 1:1 winding ratio; and an output matching network configured to impedance match between the output transformer and antenna and provide voltage step up.

19. The system of claim 18 wherein the input transformer has a ratio of 2N:N where N is any whole number.

20. The system of claim 18 wherein at least one center tap of the input transformer connects to a bias voltage.

* * * * *